United States Patent
Hsin et al.

(10) Patent No.: US 6,874,227 B2
(45) Date of Patent: Apr. 5, 2005

(54) METHOD FOR PACKAGING AN IMAGE SENSOR

(75) Inventors: Chung Hsien Hsin, Hsinchu Hsien (TW); Hsiu-Wen Tu, Hsinchu Hsien (TW); Jason Chuang, Hsinchu Hsien (TW); Irving You, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/454,649

(22) Filed: Jun. 3, 2003

(65) Prior Publication Data

US 2004/0244192 A1 Dec. 9, 2004

(51) Int. Cl.$^7$ ................................................. H05K 3/30
(52) U.S. Cl. .......................... 29/832; 29/825; 29/833; 29/840; 438/123; 438/124
(58) Field of Search .................... 29/825, 827, 832, 29/833, 840; 438/123, 124

(56) References Cited

U.S. PATENT DOCUMENTS

| | | | | |
|---|---|---|---|---|
| 5,070,041 A | * | 12/1991 | Katayama et al. ............ 29/827 |
| 6,130,448 A | * | 10/2000 | Bauer et al. ................. 257/222 |
| 6,191,359 B1 | * | 2/2001 | Sengupta et al. ........... 174/52.3 |
| 6,291,263 B1 | * | 9/2001 | Huang ......................... 438/106 |
| 6,509,636 B1 | * | 1/2003 | Tsai et al. ................... 257/678 |
| 6,680,525 B1 | * | 1/2004 | Hsieh et al. ................. 257/680 |
| 6,747,261 B1 | * | 6/2004 | Hsieh et al. ............. 250/208.1 |
| 6,753,922 B1 | * | 6/2004 | Sengupta et al. ........... 348/374 |

* cited by examiner

*Primary Examiner*—Carl J. Arbes
(74) *Attorney, Agent, or Firm*—Pro-Techtor International Services

(57) ABSTRACT

A method for packaging an image sensor includes the steps of: providing a substrate having an upper surface and a lower surface; mounting a frame layer to the upper surface of the substrate to form a chamber together with the substrate; mounting a photosensitive chip to the upper surface of the substrate and within the chamber, and electrically connecting the photosensitive chip to the substrate; mounting a transparent layer to the frame layer with a B-stage adhesive applied therebetween; pre-baking the B-stage adhesive to slightly adhere the transparent layer to the frame layer; testing the image sensor to determine whether the image sensor is passed or failed; and post-baking the passed image sensor to completely cure the B-stage adhesive so that the transparent layer is firmly adhered to the frame layer.

4 Claims, 2 Drawing Sheets

METHOD FOR PACKAGING AN IMAGE SENSOR

BACKGROUND OF THE INVENTION

1. Field of the Invention

The invention relates to a method for packaging an image sensor, and more particularly to a method for packaging an image sensor, which can be disassembled and reassembled.

2. Description of the Related Art

A general sensor is used to sense signals, which may be optical or audio signals. The sensor of the invention is used to receive image signals or optical signals. After receiving the image signals, the sensor converts the image signals into electrical signals, which are then transmitted to a printed circuit board via a substrate.

Referring to FIG. 1, a conventional image sensor includes a substrate 10, a frame layer 12, a photosensitive chip 14, a plurality of wires 15, and transparent glass 22. The substrate 10 has an upper surface 11 on which signal input terminals 18 are formed, and a lower surface 13 on which signal output terminals 24 are formed. The frame layer 12 is arranged on the substrate 10 to form a cavity 16 together with the substrate 10. The photosensitive chip 14 is arranged on the substrate 10 and within the cavity 16. A plurality of bonding pads 20 is formed on the photosensitive chip 14. The wires 15 electrically connect the bonding pads 20 of the photosensitive chip 14 to the signal input terminals 18 of the substrate 10, respectively. The transparent glass 22 is coated with an adhesive layer and arranged on the frame layer 12 to cover and encapsulate the photosensitive chip 14.

The packaged image sensor typically has to be tested to make its particles satisfy its quality requirement. However, when the test result represents that the particles exceed the quality standard, the transparent glass 22 cannot be removed and cleaned. Instead, the overall packaged image sensor has to be treated as waste material. Thus, the material is wasted and the manufacturing cost is high.

SUMMARY OF THE INVENTION

An object of the invention is to provide a method for packaging an image sensor, which can be disassembled and reassembled for cleaning.

To achieve the above-mentioned object, the invention provides a method for packaging an image sensor including the steps of: providing a substrate having an upper surface and a lower surface; mounting a frame layer to the upper surface of the substrate to form a chamber together with the substrate; mounting a photosensitive chip to the upper surface of the substrate and within the chamber, and electrically connecting the photosensitive chip to the substrate; mounting a transparent layer to the frame layer with a B-stage adhesive applied therebetween; pre-baking the B-stage adhesive to slightly adhere the transparent layer to the frame layer; testing the image sensor to determine whether the image sensor is passed or failed; and post-baking the passed image sensor to completely cure the B-stage adhesive so that the transparent layer is firmly adhered to the frame layer.

Thus, the transparent layer of the failed image sensor may be easily removed, cleaned and reassembled.

DETAILED DESCRIPTION OF THE INVENTION

Figure 1:
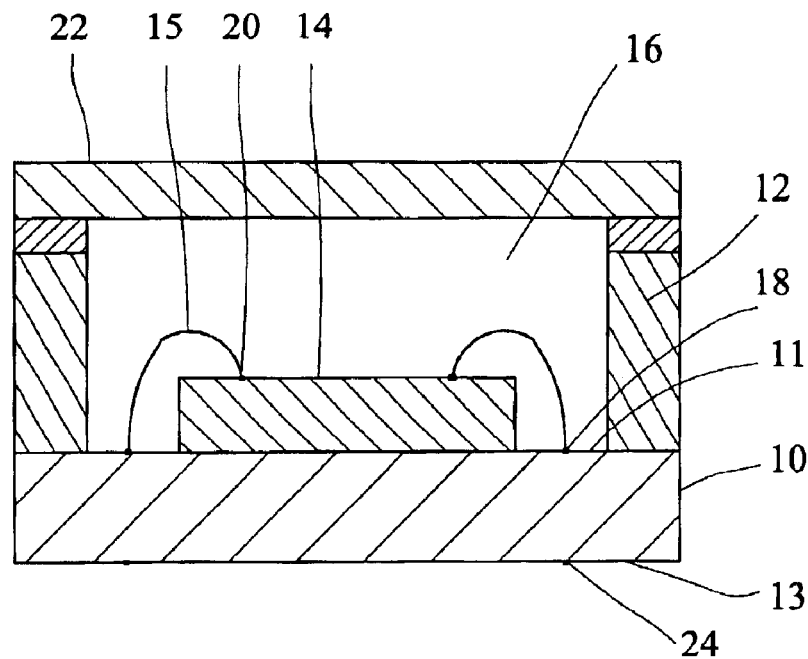
FIG. 1 is a schematic illustration showing a conventional image sensor.
Figure 2:
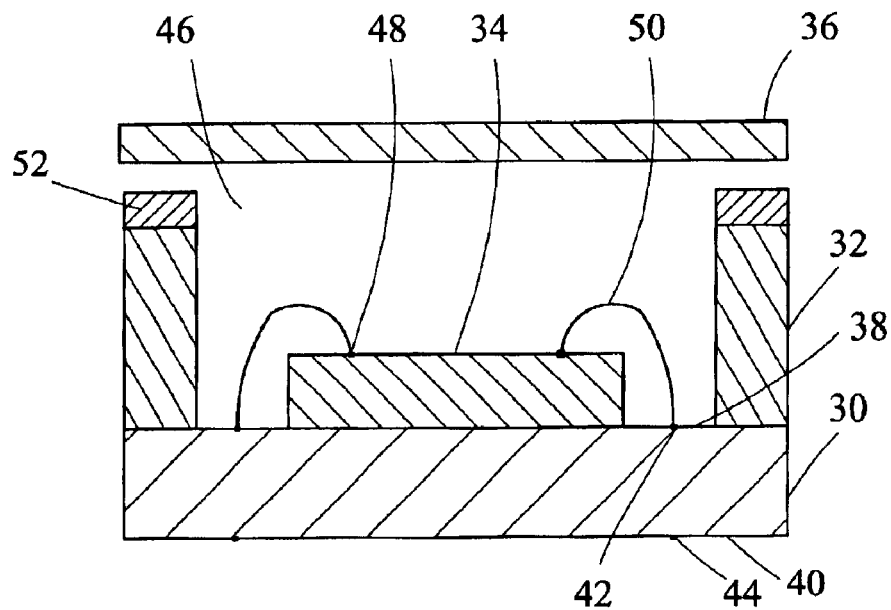
FIG. 2 is a schematic illustration showing an image sensor of the invention.

Referring to FIG. 2, an image sensor of the invention includes a substrate 30, a frame layer 32, a photosensitive chip 34, and a transparent layer 36.

The substrate 30 has an upper surface 38 formed with a plurality of first connection points 42, and a lower surface 40 formed with a plurality of second connection points 44.

The frame layer 32 is adhered to the upper surface 38 of the substrate 30 to form a chamber 46 together with the substrate.

The photosensitive chip 34 has a plurality of bonding pads 48 and is mounted to the upper surface 38 of the substrate 30 and positioned within the chamber 46. A plurality of wires 50 is used to electrically connect the bonding pads 48 to the first connection points 42 of the substrate 30 so that the signals from the photosensitive chip 34 may be transferred to the substrate 30.

The transparent layer 36 is a piece of transparent glass adhered to the frame layer 32 by a B-stage adhesive 52 so that the photosensitive chip 34 may receive optical signals passing through the transparent layer 36.

Figure 3:
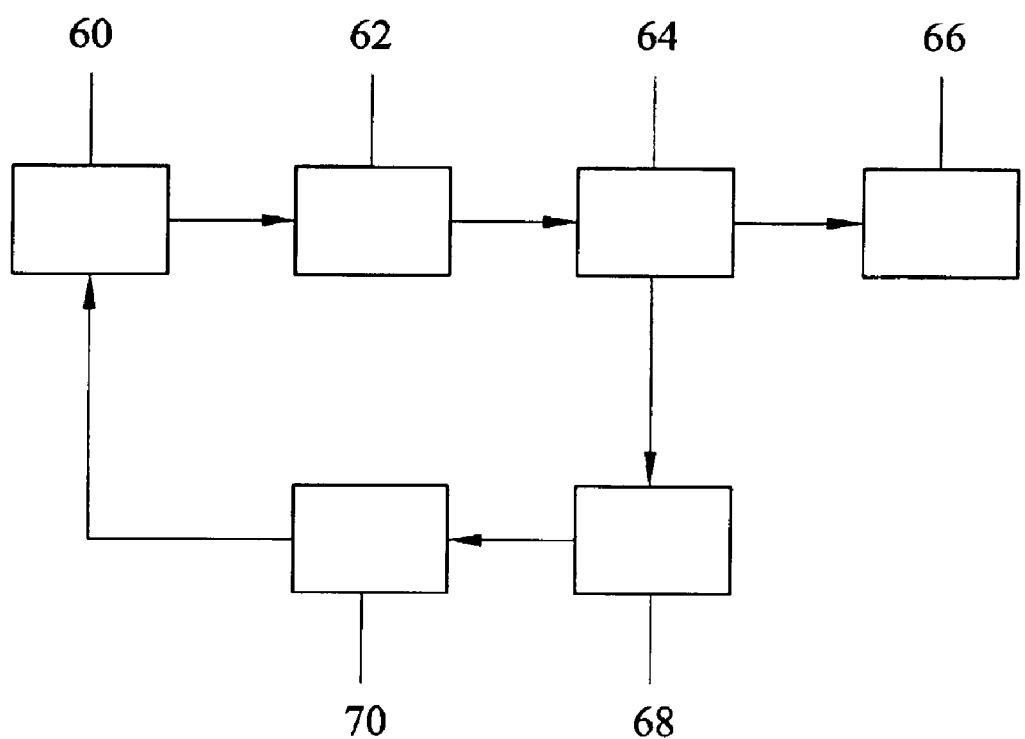
FIG. 3 is a flow chart showing a method for packaging the image sensor of the invention.

Referring to FIG. 3, a method for manufacturing the image sensor of the invention includes the following steps.

In step 60, the transparent layer 36 is placed on the frame layer 32 with the B-stage adhesive 52 applied therebetween.

In step 62, the B-stage adhesive 52 is pre-baked so that the transparent layer 36 is slightly adhered to the frame layer 32.

In step 64, the image sensor is tested to determine whether the image sensor is passed or failed.

In step 66, the passed image sensor is post-baked so that the B-stage adhesive 52 is completed cured and the transparent layer 36 is firmly adhered to the frame layer 32.

In step 68, the transparent layer 36 of the failed image sensor is removed.

In step 70, the particles are cleaned and the transparent layer 36 is placed over the frame layer 32 again.

Since the particles in the failed product can be cleaned and the product can be reassembled, the manufacturing cost may be greatly reduced.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A method for packaging an image sensor, comprising the steps of:

providing a substrate having an upper surface and a lower surface;

mounting a frame layer to the upper surface of the substrate to form a chamber together with the substrate;

mounting a photosensitive chip to the upper surface of the substrate and within the chamber, and electrically connecting the photosensitive chip to the substrate;

mounting a transparent layer to the frame layer with a B-stage adhesive applied therebetween;

pre-baking the B-stage adhesive to slightly adhere the transparent layer to the frame layer;

testing the image sensor to determine whether the image sensor is passed or failed; and post-baking the passed image sensor to completely cure the B-stage adhesive so that the transparent layer is firmly adhered to the frame layer.

2. The method according to claim 1, wherein the upper surface of the substrate is formed with a plurality of first connection points electrically connected to the photosensitive chip.

3. The method according to claim 2, wherein the photosensitive chip is electrically connected to the first connection points of the substrate via a plurality of wires.

4. The method according to claim 1, wherein the lower surface of the substrate is formed with a plurality of second connection points.

\* \* \* \* \*